(12) United States Patent
Ueda et al.

(10) Patent No.: US 12,341,031 B2
(45) Date of Patent: Jun. 24, 2025

(54) LIGHT IRRADIATION TYPE HEAT TREATMENT METHOD AND HEAT TREATMENT APPARATUS

(71) Applicant: SCREEN Holdings Co., Ltd., Kyoto (JP)

(72) Inventors: Akitsugu Ueda, Kyoto (JP); Kazuhiko Fuse, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 18/393,265

(22) Filed: Dec. 21, 2023

(65) Prior Publication Data

US 2024/0128096 A1   Apr. 18, 2024

Related U.S. Application Data

(63) Continuation of application No. 17/686,415, filed on Mar. 4, 2022, now Pat. No. 11,901,200, which is a (Continued)

(30) Foreign Application Priority Data

Mar. 8, 2019   (JP) .................................. 2019-042443

(51) Int. Cl.
  *H01L 21/67*   (2006.01)
  *H01L 21/02*   (2006.01)
  (Continued)

(52) U.S. Cl.
  CPC .. *H01L 21/67115* (2013.01); *H01L 21/02164* (2013.01); *H01L 21/02238* (2013.01); (Continued)

(58) Field of Classification Search
  CPC ......... H01L 21/0231; H01L 21/02345–02354; H01L 21/26–2686; H01L 21/67115; H01L 21/02255
  See application file for complete search history.

(56) References Cited

U.S. PATENT DOCUMENTS

| 5,926,741 A | 7/1999 | Matsuoka et al. |
| 2001/0006853 A1 | 7/2001 | Tanabe |

(Continued)

FOREIGN PATENT DOCUMENTS

| JP | H10-032328 A | 2/1998 |
| JP | H11-186248 A | 7/1999 |

(Continued)

OTHER PUBLICATIONS

Notice of Final Rejection dated Nov. 3, 2021 in counterpart Korean Patent Application No. 10-2020-0020891 with English translation obtained from Global Dossier.

(Continued)

*Primary Examiner* — Evan G Clinton
(74) *Attorney, Agent, or Firm* — OSTROLENK FABER LLP

(57) ABSTRACT

A silicon semiconductor wafer is transported into a chamber, and preheating of the semiconductor wafer is started in a nitrogen atmosphere by irradiation with light from halogen lamps. When the temperature of the semiconductor wafer reaches a predetermined switching temperature in the course of the preheating, oxygen gas is supplied into the chamber to change the atmosphere within the chamber from the nitrogen atmosphere to an oxygen atmosphere. Thereafter, a front surface of the semiconductor wafer is heated for an extremely short time period by flash irradiation. Oxidation is suppressed when the temperature of the semiconductor wafer is relatively low below the switching temperature, and is caused after the temperature of the semiconductor wafer (Continued)

becomes relatively high. As a result, a dense, thin oxide film having good properties with fewer defects at an interface with a silicon base layer is formed on the front surface of the semiconductor wafer.

10 Claims, 11 Drawing Sheets

Related U.S. Application Data continuation of application No. 16/727,129, filed on Dec. 26, 2019, now Pat. No. 11,322,375.

(51) Int. Cl.
   *H01L 21/324* (2006.01)
   *H05B 3/00* (2006.01)
   *H01L 21/677* (2006.01)
   *H01L 21/687* (2006.01)

(52) U.S. Cl.
   CPC ......... *H01L 21/324* (2013.01); *H05B 3/0047* (2013.01); *H01L 21/02255* (2013.01); *H01L 21/67742* (2013.01); *H01L 21/68785* (2013.01)

(56) References Cited

U.S. PATENT DOCUMENTS

| | | | |
|---|---|---|---|
| 2002/0037616 A1* | 3/2002 | Fujita | H01L 21/76235 438/296 |
| 2002/0052124 A1 | 5/2002 | Raaijmakers | |
| 2003/0127051 A1 | 7/2003 | Fritzemeier et al. | |
| 2003/0155615 A1* | 8/2003 | Yoshida | H01L 29/66772 257/350 |
| 2004/0266214 A1* | 12/2004 | Suguro | H01L 21/28185 257/E21.258 |
| 2006/0225657 A1 | 10/2006 | Mizushima et al. | |
| 2009/0275212 A1 | 11/2009 | Kato | |
| 2010/0117203 A1 | 5/2010 | Bailey et al. | |
| 2010/0273333 A1 | 10/2010 | Kato | |
| 2013/0078744 A1* | 3/2013 | Kiyama | H01L 21/02181 438/5 |
| 2013/0260546 A1 | 10/2013 | Yamada et al. | |
| 2017/0062249 A1* | 3/2017 | Aoyama | H01L 21/28185 |
| 2017/0372946 A1 | 12/2017 | Peidous | |
| 2018/0166281 A1 | 6/2018 | Fuse et al. | |
| 2018/0240681 A1 | 8/2018 | Ono et al. | |
| 2019/0164789 A1 | 5/2019 | Aoyama et al. | |

FOREIGN PATENT DOCUMENTS

| | | |
|---|---|---|
| JP | 2005-19650 A | 1/2005 |
| JP | 2006-294750 A | 10/2006 |
| JP | 2009-272402 A | 11/2009 |
| JP | 2010-258359 A | 11/2010 |
| JP | 2013-84902 A | 5/2013 |
| JP | 2013-207033 A | 10/2013 |
| JP | 2014-192179 A | 10/2014 |
| JP | 2017-045982 A | 3/2017 |
| JP | 2018-018847 A | 2/2018 |
| JP | 2018-137378 A | 8/2018 |
| KR | 10-2018-0067413 A | 6/2018 |
| TW | 200933737 A | 8/2009 |

OTHER PUBLICATIONS

Notice of Final Rejection dated Sep. 7, 2021 in counterpart Korean Patent Application No. 10-2020-0020891 with English translation obtained from Global Dossier.

Office Action with Search Report dated Nov. 11, 2021 in counterpart Taiwan Patent Application No. 109101152 and partial English translation based on Japanese translation of the original communication prepared by the Taiwanese representative.

Notification of Reason for Refusal dated Mar. 16, 2021 in corresponding Korean Patent Application No. 10-2020-0020891 with English translation obtained from the JPO.

Decision on Appeal dated May 30, 2022 in counterpart Korean Patent Application No. 10-2020-0020891 with partial English translation.

Notice of Reasons for Refusal dated Feb. 14, 2023 in corresponding Japanese Patent Application No. 2019-042443 and a computer generated English translation obtained from the JPO.

Notice of Reasons for Refusal dated Oct. 18, 2022 in corresponding Japanese Patent Application No. 2019-042443 and a computer generated English translation obtained from the JPO.

First Office Action and Search Report dated Jul. 4, 2024 in corresponding Chinese Patent Application No. 202010013959.4 and English language computer generated translation made from the Japanese translation of the original communication.

* cited by examiner

F I G . 4
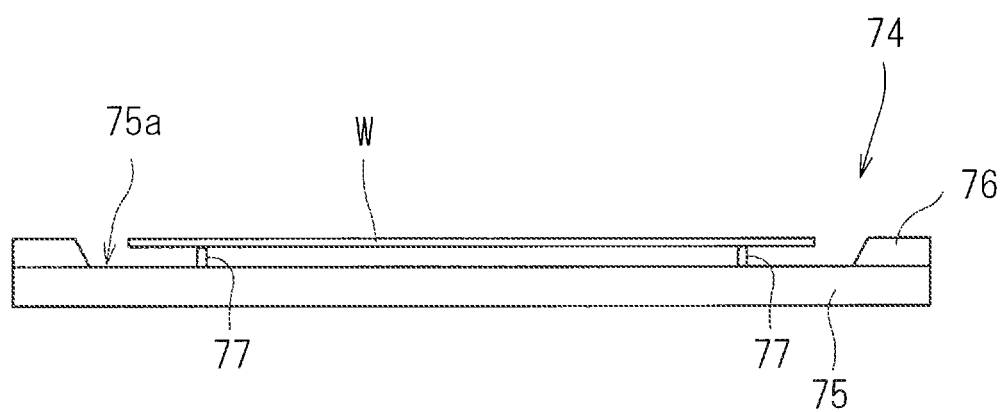

F I G . 5
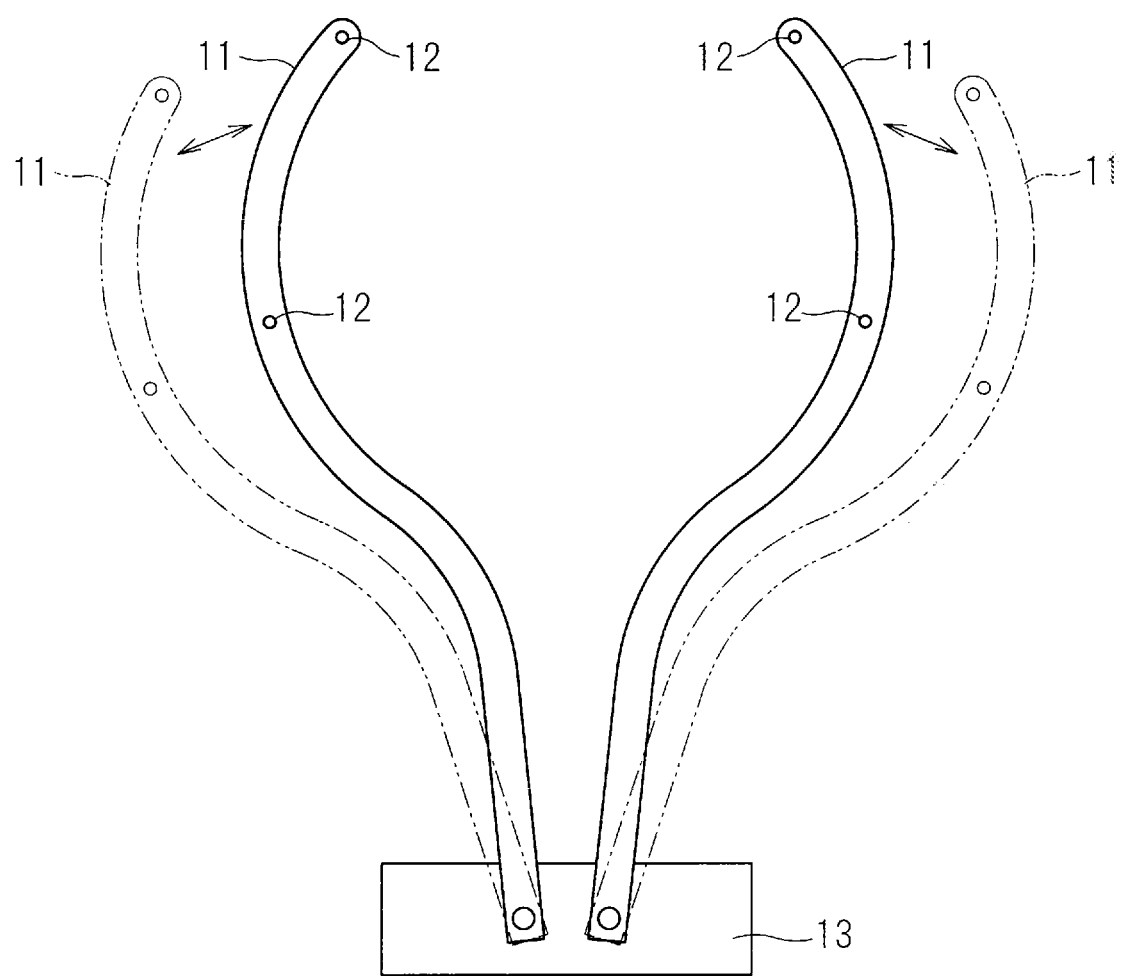

F I G . 6
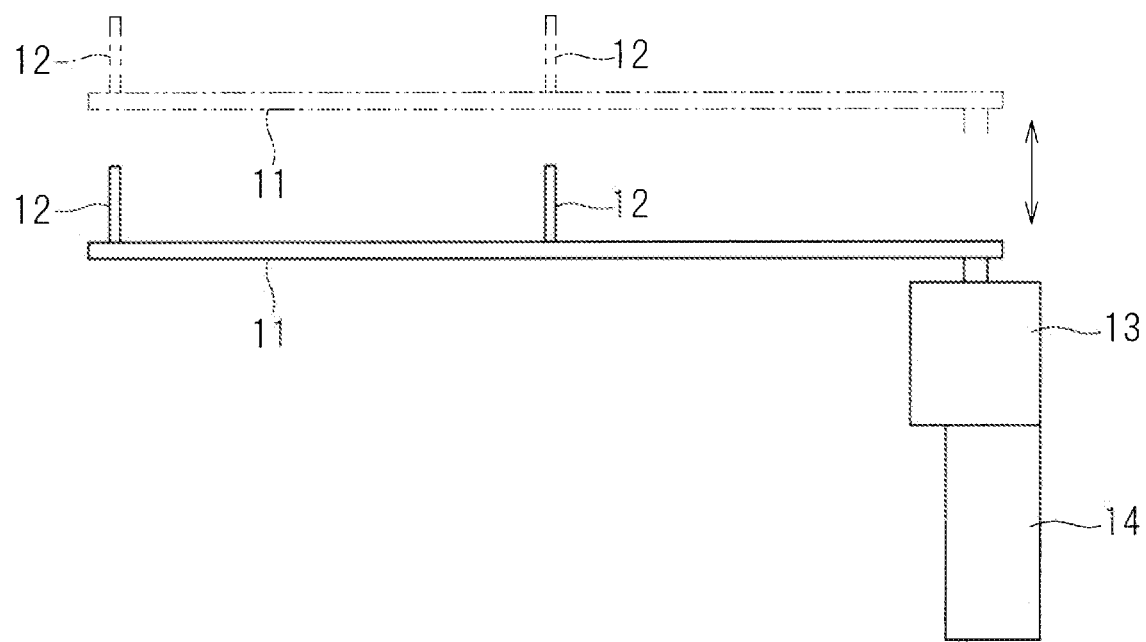

F I G. 8
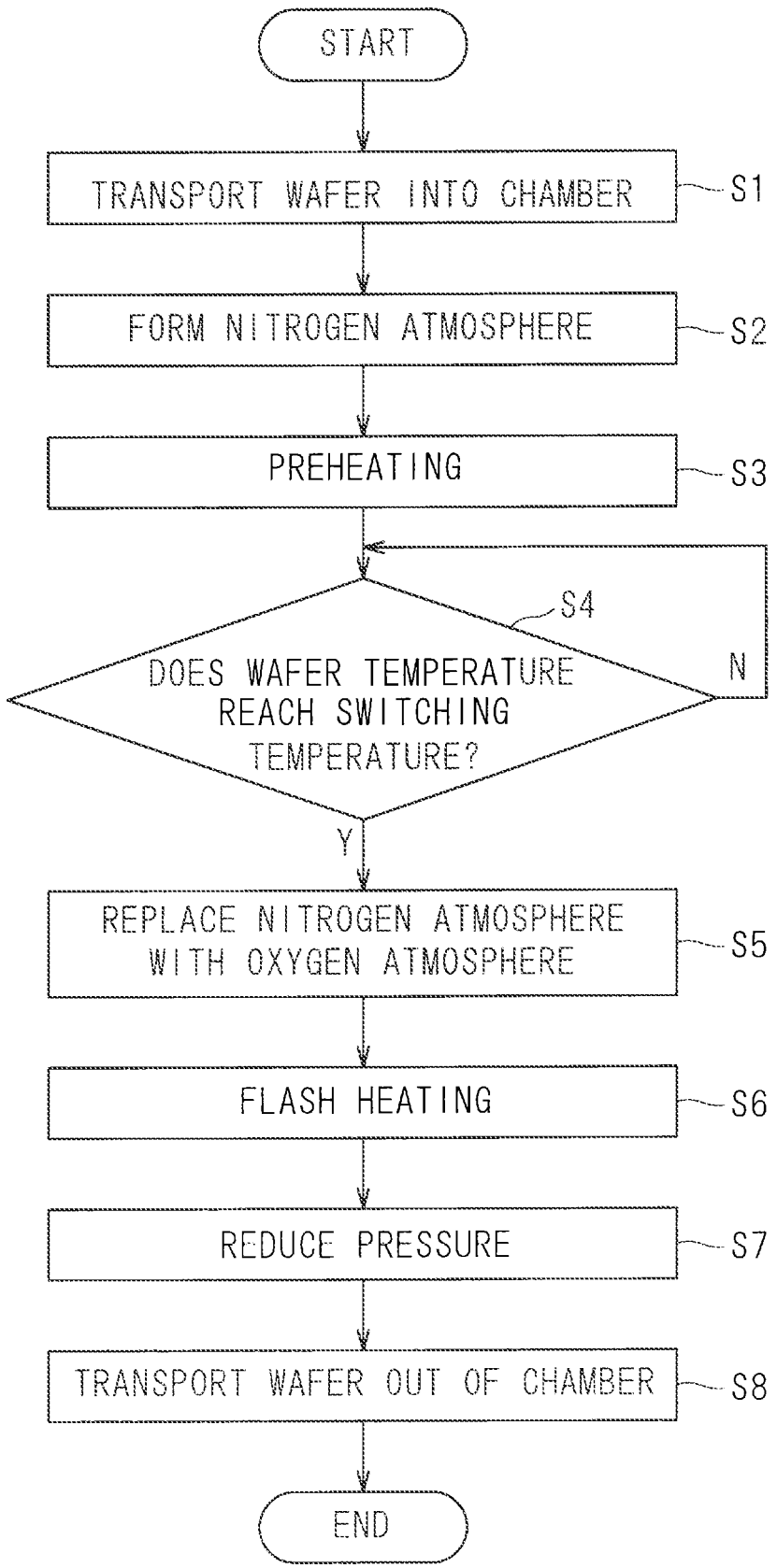

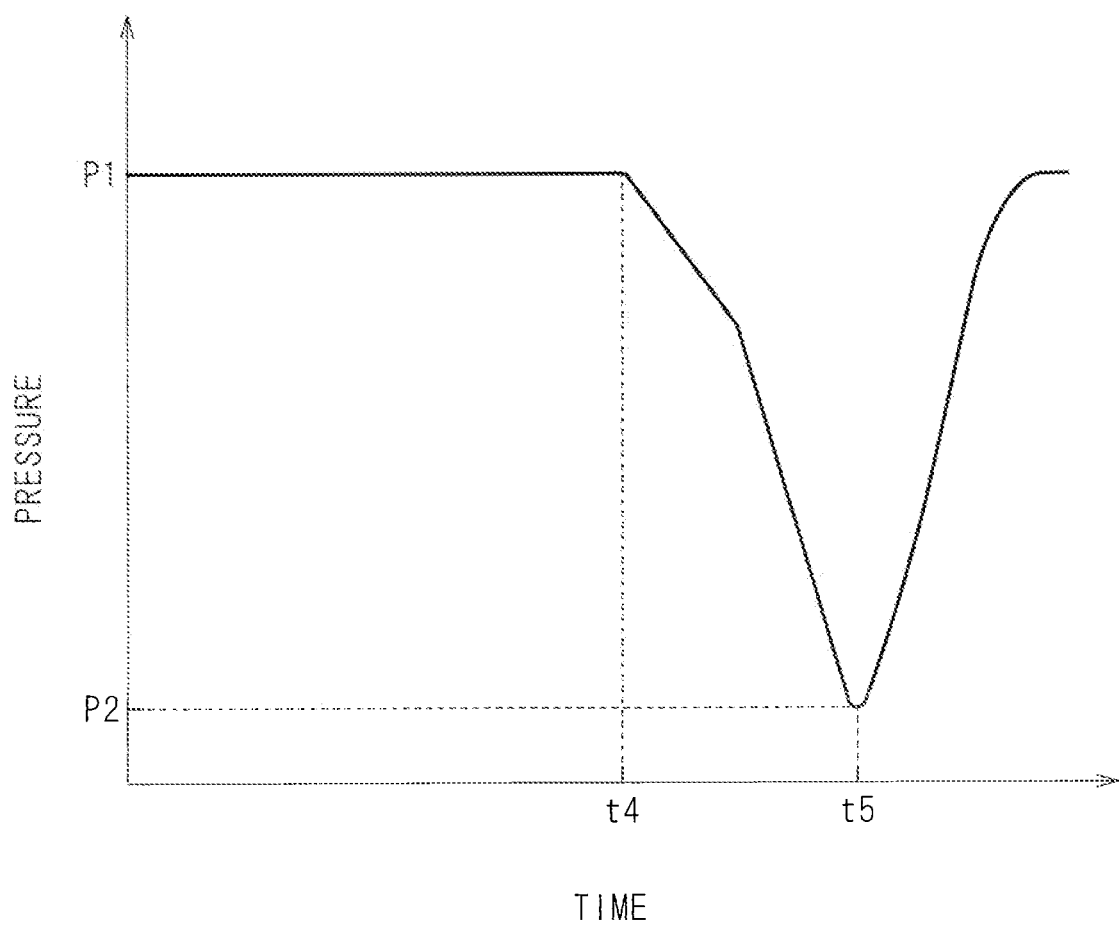

LIGHT IRRADIATION TYPE HEAT TREATMENT METHOD AND HEAT TREATMENT APPARATUS

CROSS-REFERENCE TO RELATED APPLICATIONS

The present patent application is a continuation of prior U.S. patent application Ser. No. 17/686,415, filed Mar. 4, 2022, by Akitsugu UEDA and Kazuhiko FUSE, entitled "LIGHT IRRADIATION TYPE HEAT TREATMENT METHOD AND HEAT TREATMENT APPARATUS," which is a continuation of U.S. patent application Ser. No. 16/727,129, filed Dec. 26, 2019, now U.S. Pat. No. 11,322,375 B2, issued May 3, 2022, by Akitsugu UEDA and Kazuhiko FUSE, entitled "LIGHT IRRADIATION TYPE HEAT TREATMENT METHOD AND HEAT TREATMENT APPARATUS," which claims priority to Japanese Patent Application No. 2019-042443, filed Mar. 8, 2019. The contents of each of the patent applications listed above are incorporated in full herein by reference.

BACKGROUND OF THE INVENTION

Field of the Invention

The present invention relates to a heat treatment method and a heat treatment apparatus which irradiate a thin plate-like precision electronic substrate (hereinafter referred to simply as a "substrate") such as a semiconductor wafer with light to heat the substrate, thereby forming an oxide film.

DESCRIPTION OF THE BACKGROUND ART

Thin films of silicon dioxide ($SiO_2$) produced by oxidizing silicon (Si) have heretofore been used widely as gate insulator films for field-effect transistors (FETs), but are being replaced with high dielectric constant films (high-k films) employing a material having a dielectric constant higher than that of silicon dioxide in recent years. For the purpose of solving the problem of an increase in leakage current with the reduction in thickness of the gate insulator films, the high dielectric constant films have been developed as a new stack structure together with metal gate electrodes employing metal as the material of gate electrodes.

Even when a high dielectric constant film is used as a gate insulator film, a thin film of silicon dioxide is formed as an interface layer film (underlying film) between a base layer of silicon and the high dielectric constant film (as disclosed, for example, in U.S. Patent Application Publication No. 2017/0062249). This is because the direct deposition of the high dielectric constant film on the base layer of silicon develops more defects at the interface therebetween to result in an increase in leakage current. The formation of the thin film of silicon dioxide between the base layer of silicon and the high dielectric constant film improves matching at the interface to reduce the leakage current. In other words, it can be said that the formation of a silicon oxide film is one important element in a semiconductor device manufacturing technique.

A silicon oxide film is typically formed by a thermal oxidation method. Treatment of silicon in an oxidizing atmosphere at high temperature forms a silicon oxide film with good matching at an interface with silicon.

Unfortunately, conventional thermal oxidation methods cannot provide silicon oxide films with sufficiently good properties in some cases because an oxidation reaction of silicon starts at a temperature lower than a desired oxidation temperature when silicon wafers are transported into a furnace for oxidation. Also, conventional thermal oxidation methods thermally oxidize silicon in a furnace over a relatively long time period. It is hence difficult for the conventional thermal oxidation methods to control the thickness of the silicon oxide films on the order of nanometers.

SUMMARY

The present invention is intended for a method of irradiating a substrate with light to heat the substrate, thereby forming an oxide film.

According to one aspect of the present invention, the method comprises the steps of: (a) putting a substrate into a chamber; (b) irradiating the substrate with light to heat the substrate; and (c) supplying an oxidizing gas into the chamber to change an atmosphere within the chamber from an inert gas atmosphere to an oxidizing atmosphere when the temperature of the substrate reaches a predetermined switching temperature in the course of the step (b).

Oxidation is suppressed when the temperature of the substrate is relatively low below the switching temperature, and is caused after the temperature of the substrate becomes relatively high. This method is capable of forming a thin oxide film having good properties on the substrate.

Preferably, the supply of the oxidizing gas into the chamber is stopped and pressure within the chamber is reduced after the completion of the step (b).

The method is capable of promptly stopping the growth of the oxide film to suitably control the thickness of the oxide film.

The present invention is also intended for a heat treatment apparatus for irradiating a substrate with light to heat the substrate, thereby forming an oxide film.

According to one aspect of the present invention, the heat treatment apparatus comprises: a chamber for receiving a substrate therein; a light irradiator for irradiating the substrate with light to heat the substrate; a gas supply part for supplying an oxidizing gas into the chamber; and a controller for controlling the gas supply part so as to supply the oxidizing gas into the chamber to change an atmosphere within the chamber from an inert gas atmosphere to an oxidizing atmosphere when the temperature of the substrate reaches a predetermined switching temperature in the course of the process of heating the substrate by irradiating the substrate with light from the light irradiator.

Oxidation is suppressed when the temperature of the substrate is relatively low below the switching temperature, and is caused after the temperature of the substrate becomes relatively high. This heat treatment apparatus is capable of forming a thin oxide film having good properties on the substrate.

Preferably, the heat treatment apparatus further comprises a pressure reduction part for reducing pressure within the chamber, wherein the gas supply part stops the supply of the oxidizing gas into the chamber and the pressure reduction part reduces the pressure within the chamber after the completion of the process of heating the substrate by irradiating the substrate with light from the light irradiator.

The heat treatment apparatus is capable of promptly stopping the growth of the oxide film to suitably control the thickness of the oxide film.

It is therefore an object of the present invention to form a thin oxide film with good properties.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a sectional view of the susceptor;

FIG. 5 is a plan view of a transfer mechanism;

FIG. 6 is a side view of the transfer mechanism;

FIG. 8 is a flow diagram showing a procedure for a heat treatment method according to the present invention;

FIG. 11 is a graph showing changes in pressure within the chamber.

DESCRIPTION OF THE PREFERRED EMBODIMENTS

A preferred embodiment according to the present invention will now be described in detail with reference to the drawings.

Figure 1:
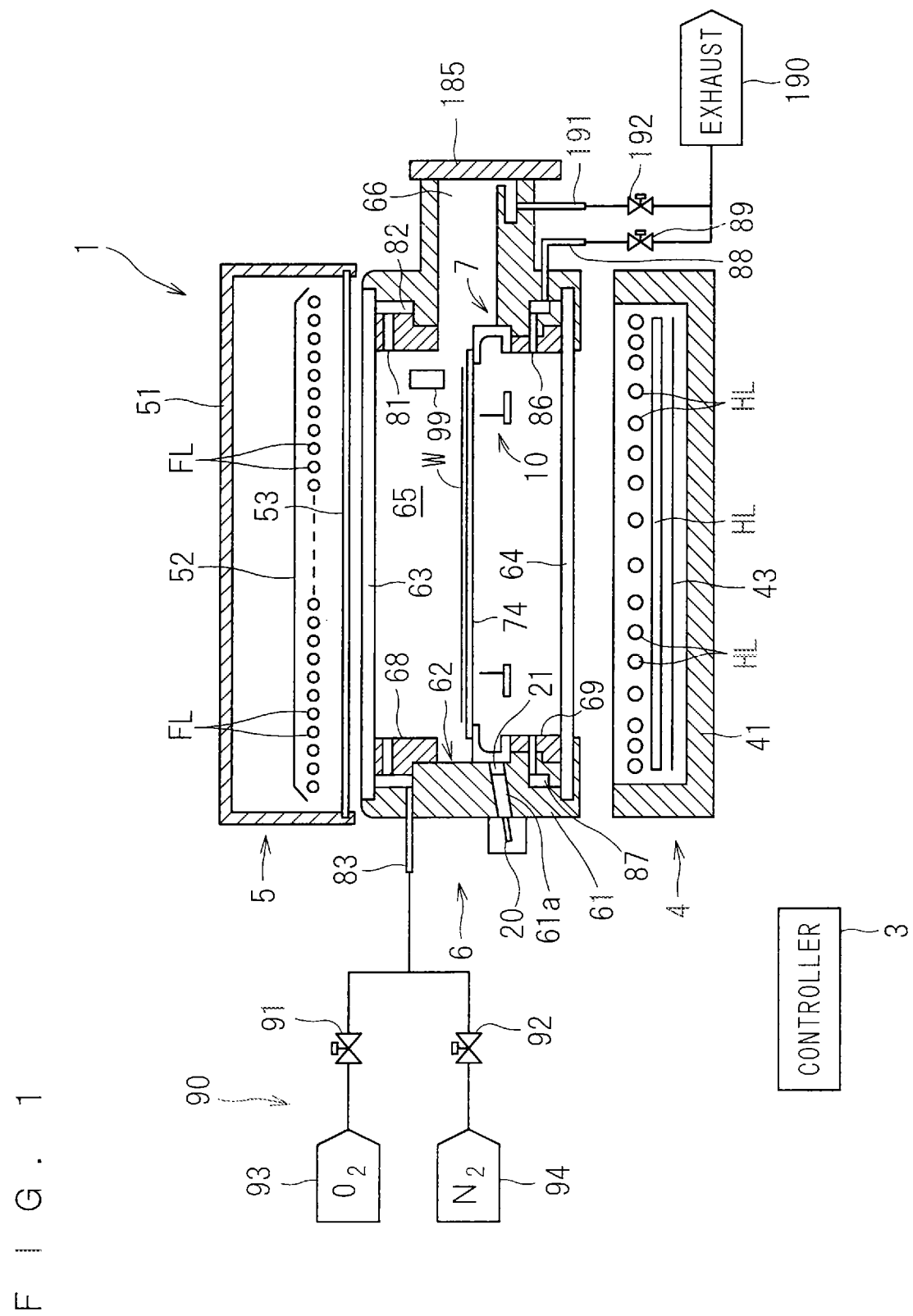
FIG. 1 is a longitudinal sectional view showing a configuration of a heat treatment apparatus according to the present invention.

First, a heat treatment apparatus according to the present invention will be described. FIG. 1 is a longitudinal sectional view showing a configuration of a heat treatment apparatus 1 according to the present invention. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm. It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a gas supply part 90 for supplying a treatment gas into the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

The chamber side portion 61 is further provided with a through hole 61a bored therein. A radiation thermometer 20 is mounted in a location of an outer wall surface of the chamber side portion 61 where the through hole 61a is provided. The through hole 61a is a cylindrical hole for directing infrared radiation emitted from a lower surface of a semiconductor wafer W held by a susceptor 74 to be described later therethrough to the radiation thermometer 20. The through hole 61a is inclined with respect to a horizontal direction so that a longitudinal axis (an axis extending in a direction in which the through hole 61a extends through the chamber side portion 61) of the through hole 61a intersects a main surface of the semiconductor wafer W held by the susceptor 74. A transparent window 21 made of barium fluoride material transparent to infrared radiation in a wavelength range measurable with the radiation thermometer 20 is mounted to an end portion of the through hole 61a which faces the heat treatment space 65. The radiation thermometer 20 receives infrared radiation emitted from the lower surface of the semiconductor wafer W through the transparent window 21 to measure the temperature of the semiconductor wafer W, based on the intensity of the received infrared radiation.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a supply pipe 83 of the gas supply part 90 through a buffer space 82 provided in the form of an annular ring inside the side wall of the chamber 6. The supply pipe 83 is divided into two branch pipes. One of the two branch pipes is connected to an oxygen supply source 93, and the other is connected to a nitrogen supply source 94. The branch pipe branched off from the supply pipe 83 and connected to the oxygen supply source 93 is provided with a valve 91, and the branch pipe branched off from the supply pipe 83 and connected to the nitrogen supply source 94 is provided with a valve 92. When the valve 91 is opened, oxygen gas ($O_2$) is fed from the oxygen supply source 93 to the supply pipe 83. On the other hand, when the valve 92 is opened, nitrogen gas ($N_2$) is fed from the nitrogen supply source 94 to the supply pipe 83. When both the valve 91 and the valve 92 are opened, a gas mixture of oxygen and nitrogen is fed to the supply pipe 83. The oxygen supply source 93, the nitrogen supply source 94, the valve 91, the valve 92, and the supply pipe 83 constitute the gas supply part 90 of the heat treatment apparatus 1. The treatment gas fed through the supply pipe 83 flows into the buffer space 82. The treatment gas flows in a spreading manner within the buffer space 82 which is lower in fluid resistance than the gas supply opening 81, and is supplied through the gas supply opening 81 into the heat treatment space 65. The supply flow rates of oxygen and nitrogen are adjustable by respective flow regulating valves not shown and the like provided in the branch pipes.

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is interposed in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

The exhaust part 190 includes an exhaust pump. By opening the valves 89 and 192 while the exhaust part 190 is in operation, an atmosphere within the chamber 6 is exhausted through the gas exhaust pipes 88 and 191 to the exhaust part 190. When the atmosphere within the heat treatment space 65 which is an enclosed space is exhausted by the exhaust part 190 while no gas is supplied through the gas supply opening 81 into the heat treatment space 65, pressure within the chamber 6 is reduced to a pressure lower than atmospheric pressure. That is, the exhaust part 190 functions also as a pressure reduction part for reducing the pressure within the chamber 6.

Figure 2:
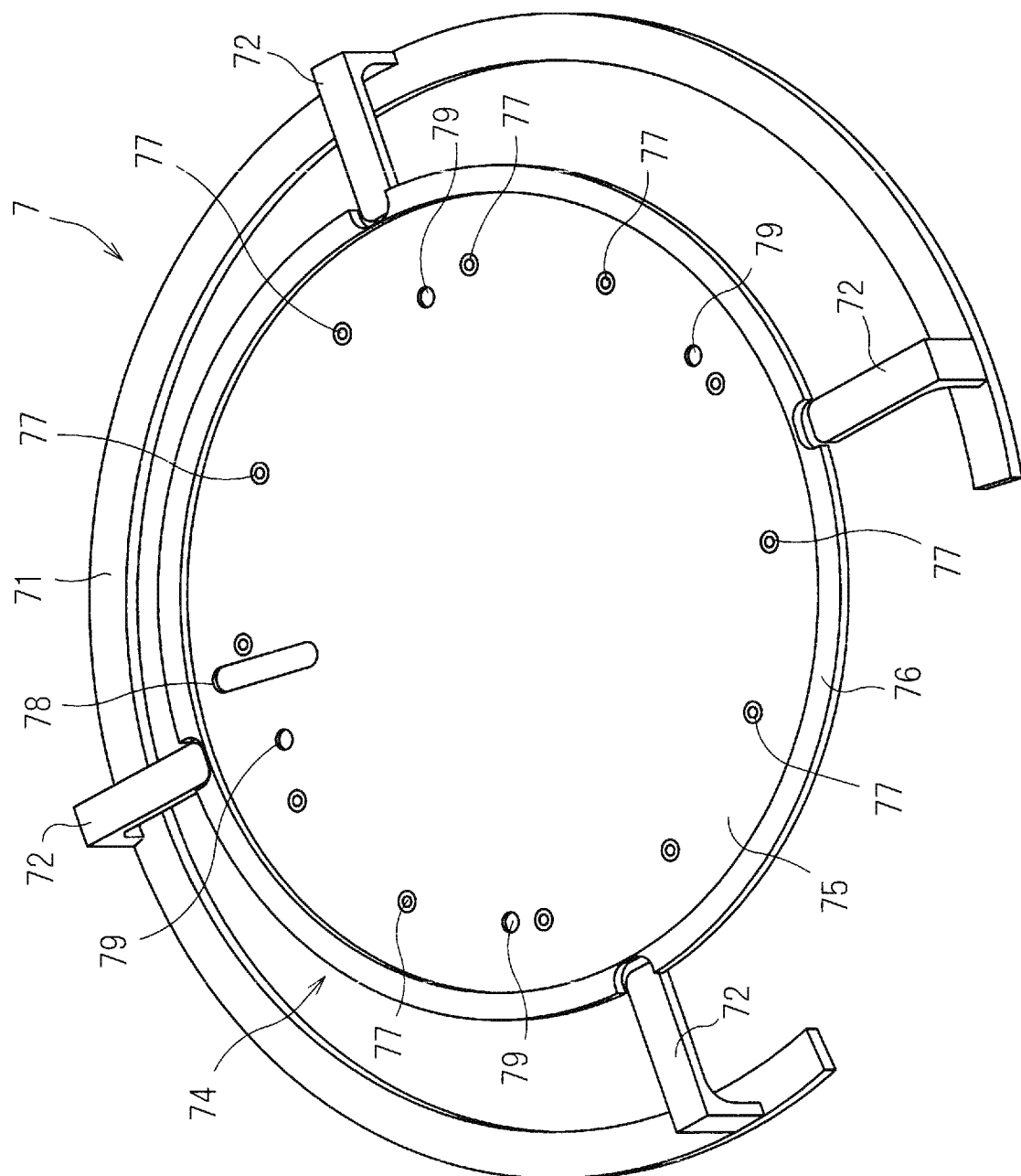
FIG. 2 is a perspective view showing the entire external appearance of a holder.

FIG. 2 is a perspective view showing the entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 3:
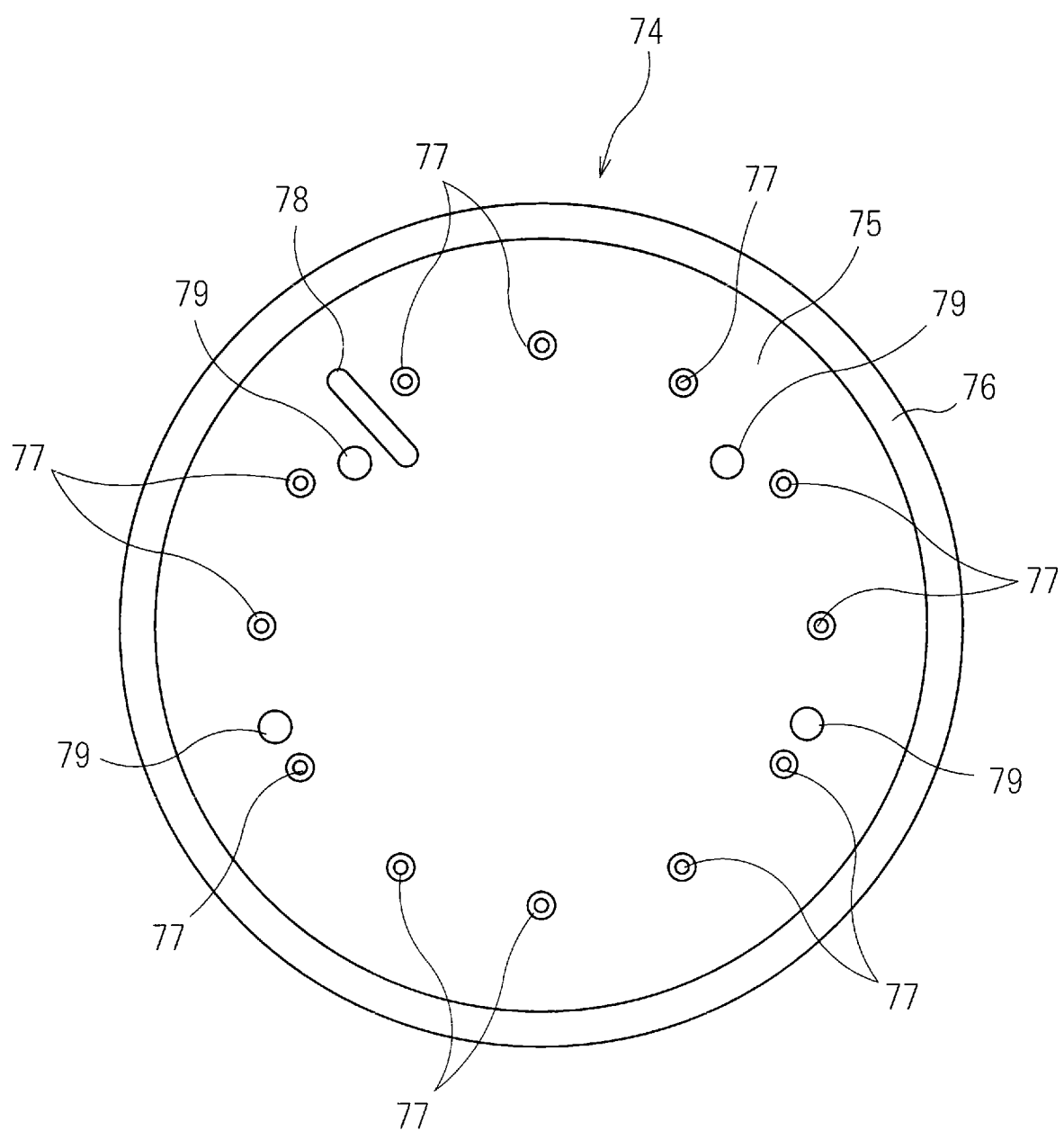
FIG. 3 is a plan view of a susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (in the present preferred embodiment, 270 mm) when the diameter of the semiconductor wafer W is 300 mm Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

A semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is provided in the holding plate 75 of the susceptor 74 so as to extend vertically through the holding plate 75 of the susceptor 74. The opening 78 is provided for the radiation thermometer 20 to receive radiation (infrared radiation) emitted from the lower surface of the semiconductor wafer W. Specifically, the radiation thermometer 20 receives the radiation emitted from the lower surface of the semiconductor wafer W through the opening 78 and the transparent window 21 mounted to the through hole 61a in the chamber side portion 61 to measure the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, an oxygen analyzer 99 is provided in the chamber 6. The oxygen analyzer 99 measures the concentration of oxygen in the atmosphere within the chamber 6.

The flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane. A region in which the flash lamps FL are arranged has a size, as seen in plan view, greater than that of the semiconductor wafer W.

Each of the xenon flash lamps FL includes a cylindrical glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 directs light from under the chamber 6 through the lower chamber window 64 toward the heat treatment space 65 to heat the semiconductor wafer W by means of the halogen lamps HL.

Figure 7:
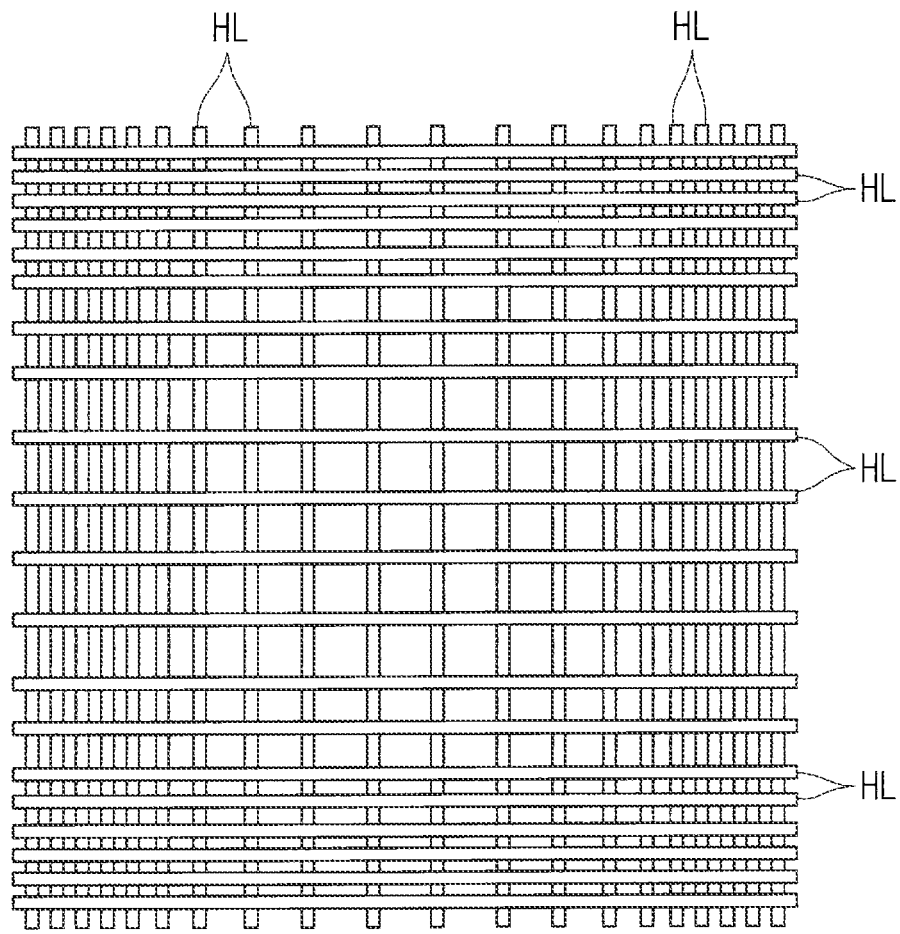
FIG. 7 is a plan view showing an arrangement of halogen lamps.

FIG. 7 is a plan view showing an arrangement of the multiple halogen lamps HL. The 40 halogen lamps HL are arranged in two tiers, i.e. upper and lower tiers. That is, halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to a peripheral portion of the semiconductor wafer W held by the holder 7 than in a region opposed to a central portion thereof. In other words, the halogen lamps HL in each of the upper and lower tiers are arranged at shorter intervals in a peripheral portion of the lamp arrangement than in a central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. That is, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like thereon. The CPU in the controller 3 executes a predetermined processing program, whereby the processes in the heat treatment apparatus 1 proceed.

The heat treatment apparatus 1 further includes, in addition to the aforementioned components, various cooling structures to prevent an excessive temperature rise in the halogen heating part 4, the flash heating part 5, and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a heat treatment method according to the present invention will be described. FIG. 8 is a flow diagram showing a procedure for the heat treatment method according to the present invention. A semiconductor wafer to be treated in the present preferred embodiment is a silicon (Si)

semiconductor wafer W. Silicon which is a base material is exposed at least partially at a front surface of the semiconductor wafer W. Prior to the heat treatment method according to the present invention, a cleaning process using hydrofluoric acid and the like may be performed on the front surface of the semiconductor wafer W to remove a native oxide film formed in a location where silicon is exposed.

First, the silicon semiconductor wafer W is transported into the chamber 6 of the heat treatment apparatus 1 (Step S1). Specifically, the gate valve 185 is opened to open the transport opening 66. A transport robot outside the heat treatment apparatus 1 transports the semiconductor wafer W through the transport opening 66 into the heat treatment space 65 of the chamber 6. At this time, nitrogen gas may be supplied into the chamber 6 by opening the valve 92 and caused to flow outwardly through the transport opening 66, thereby minimizing an outside atmosphere carried into the heat treatment space 65 as the semiconductor wafer W is transported into the heat treatment space 65.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof where silicon is exposed partially is the upper surface. A predetermined distance is defined between a back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the gate valve 185 closes the transport opening 66 so that the heat treatment space 65 becomes an enclosed space, an atmosphere of nitrogen that is an inert gas is formed within the chamber 6 (Step S2). Specifically, the valve 92 is opened while the valve 91 is closed, so that nitrogen gas is supplied through the gas supply opening 81 into the heat treatment space 65. Also, the valve 89 is opened, so that the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65. Thus, the atmosphere within the chamber 6 is replaced with the nitrogen atmosphere. The gas within the chamber 6 is exhausted also through the transport opening 66 by opening the valve 192. Further, the exhaust mechanism not shown exhausts an atmosphere near the drivers of the transfer mechanism 10. Alternatively, the nitrogen atmosphere may be previously formed within the chamber 6, and the semiconductor wafer W may be then transported into the chamber 6.

Figure 9:
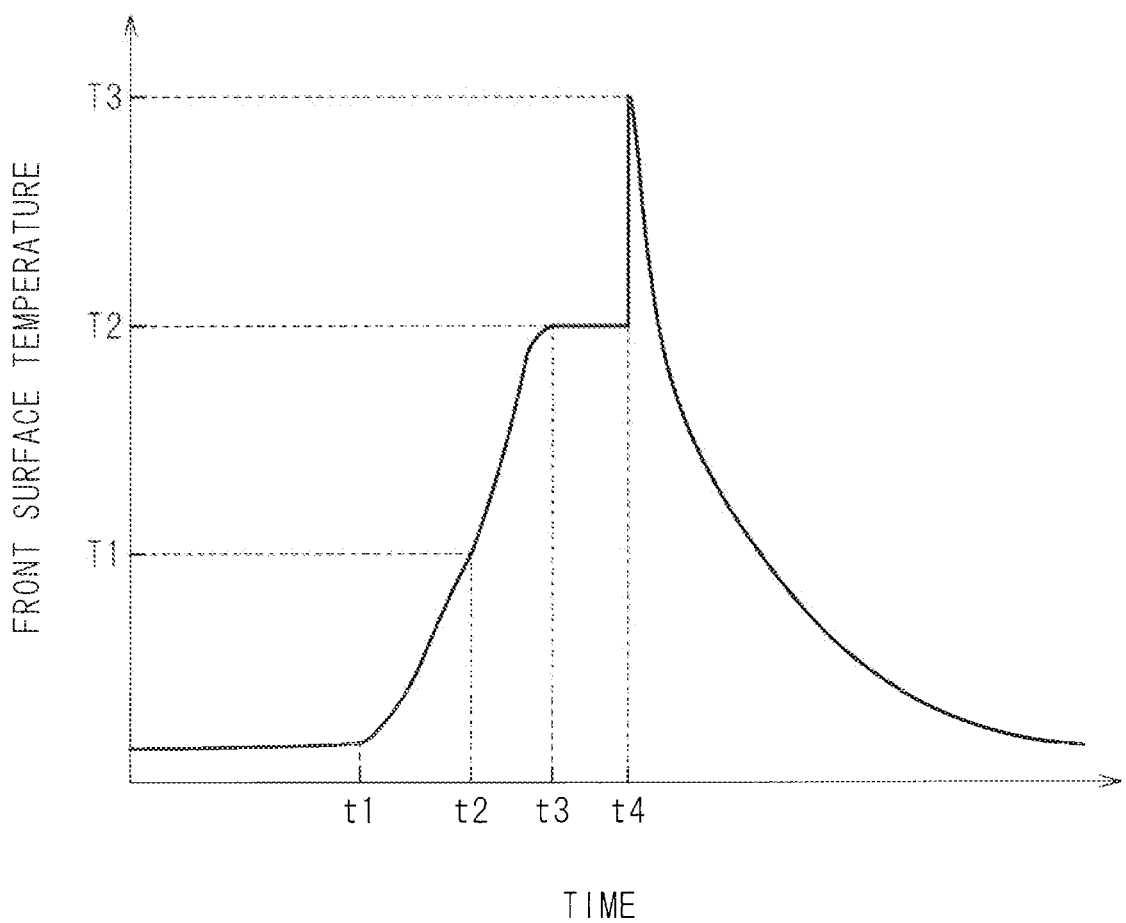
FIG. 9 is a graph showing changes in front surface temperature of a semiconductor wafer.

Next, preheating (or assist-heating) is performed on the semiconductor wafer W by the halogen lamps HL in the halogen heating part 4 (Step S3). FIG. 9 is a graph showing changes in front surface temperature of the semiconductor wafer W. At time t1, the 40 halogen lamps HL in the halogen heating part 4 turn on simultaneously to start the preheating of the semiconductor wafer W. Halogen light emitted from the halogen lamps HL is transmitted through the lower chamber window 64 and the susceptor 74 both made of quartz, and impinges upon the back surface of the semiconductor wafer W. By receiving light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the preheating using the halogen lamps HL.

The temperature of the semiconductor wafer W is measured with the radiation thermometer 20 when the halogen lamps HL perform the heating treatment. Specifically, the radiation thermometer 20 receives infrared radiation emitted from the lower surface of the semiconductor wafer W held by the susceptor 74 through the opening 78 and passing through the transparent window 21 to measure the temperature of the semiconductor wafer W which is on the increase. The measured temperature of the semiconductor wafer W is transmitted to the controller 3. The controller 3 effects feedback control of the output from the halogen lamps HL so that the temperature of the semiconductor wafer W is equal to a preheating temperature T2, based on the value measured with the radiation thermometer 20.

The controller 3 also monitors whether the temperature of the semiconductor wafer W which is on the increase by the irradiation with light from the halogen lamps HL reaches a predetermined switching temperature T1 or not (Step S4). The switching temperature T1 is 400° C. or higher. If the temperature of the semiconductor wafer W reaches the switching temperature T1 in the course of the preheating, the procedure proceeds from Step S4 to Step S5, in which the nitrogen atmosphere within the chamber 6 is replaced with an oxygen atmosphere. Specifically, when the temperature of the semiconductor wafer W reaches the switching temperature T1 at time t2, the valve 91 is opened under the control of the controller 3, so that oxygen gas is supplied from the gas supply part 90 into the chamber 6.

By supplying the oxygen gas into the chamber 6, an oxygen-containing atmosphere, i.e. an oxidizing atmosphere, is formed within the chamber 6. In the present preferred embodiment, the atmosphere within the chamber 6 is switched from the inert gas atmosphere to the oxidizing atmosphere, upon being triggered by the fact that the temperature of the semiconductor wafer W reaches the switching temperature T1. The oxygen atmosphere is formed within the chamber 6 after the temperature of the semiconductor wafer W reaches the switching temperature T1, whereby oxidation occurs in the location where silicon is exposed at the front surface of the semiconductor wafer W to start the growth of a silicon oxide film (a thin film of silicon dioxide ($SiO_2$)).

After the temperature of the semiconductor wafer W reaches the preheating temperature T2 at time t3, the controller 3 maintains the temperature of the semiconductor wafer W at the preheating temperature T2 for a short time. Specifically, at the time t3 when the temperature of the semiconductor wafer W measured with the radiation thermometer 20 reaches the preheating temperature T2, the controller 3 adjusts the output from the halogen lamps HL to maintain the temperature of the semiconductor wafer W at approximately the preheating temperature T2.

By performing such preheating using the halogen lamps HL, the temperature of the entire semiconductor wafer W is uniformly increased to the preheating temperature T2. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating.

Figure 10:
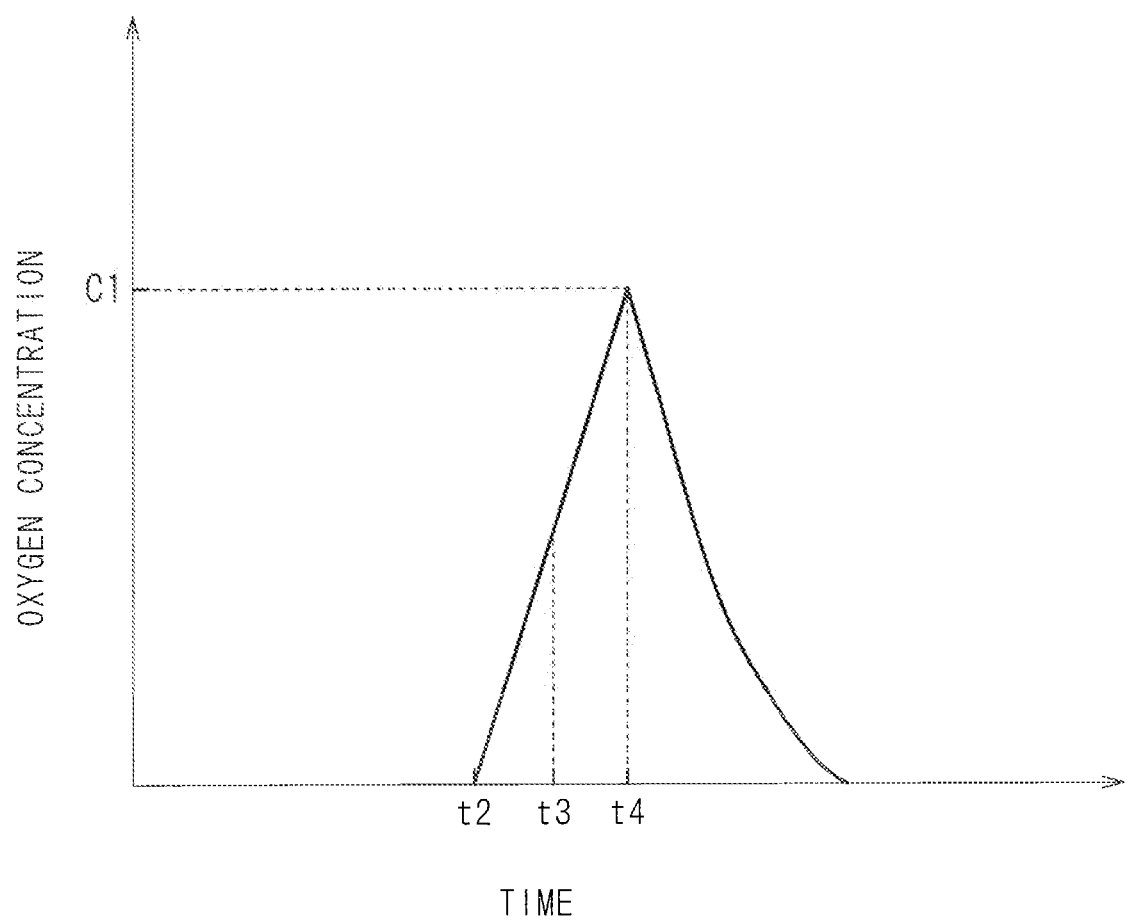
FIG. 10 is a graph showing changes in oxygen concentration within a chamber.

The oxygen gas is being continuously supplied into the chamber 6 even after the temperature of the semiconductor wafer W reaches the preheating temperature T2 at the time t3. FIG. 10 is a graph showing changes in oxygen concentration within the chamber 6. The oxygen concentration within the chamber 6 is measured with the oxygen analyzer 99. At the time t2 when the temperature of the semiconductor wafer W reaches the switching temperature T1, the supply of the oxygen gas into the chamber 6 is started, so that the oxygen concentration starts to increase. Even after the time t3 when the temperature of the semiconductor wafer W reaches the preheating temperature T2, the supply of the oxygen gas is continued, so that the oxygen concentration within the chamber 6 continues to increase. Then, at time t4 when the oxygen concentration within the chamber 6 measured with the oxygen analyzer 99 reaches a target concentration C1, the flash lamps FL in the flash heating part 5 irradiate the front surface of the semiconductor wafer W held by the susceptor 74 with a flash of light (Step S6). At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W. The target concentration C1 takes any convenient value, and may be 100%.

The flash heating, which is achieved by the emission of a flash of light from the flash lamps FL, is capable of increasing the front surface temperature of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The temperature of the front surface of the semiconductor wafer W is increased momentarily to a peak temperature T3 by the flash irradiation from the flash lamps FL, and thereafter decreases rapidly. The peak temperature T3 is higher than the preheating temperature T2.

The flash irradiation increases the temperature of the front surface of the semiconductor wafer W to the peak temperature T3, with the oxygen concentration within the chamber 6 reaching the target concentration C1. This causes thermal oxidation to proceed in the location where silicon is exposed, thereby further growing the silicon oxide film. The thickness of the silicon oxide film is prevented from exceeding a desired value and becoming excessively large because the time period for the flash irradiation is an extremely short time period ranging from 0.1 to 100 milliseconds. In the present preferred embodiment, the thickness of the silicon oxide film is approximately 1.5 nm.

Immediately after the completion of the flash irradiation, the valve 91 is closed under the control of the controller 3, so that the supply of oxygen gas into the chamber 6 is stopped. If nitrogen gas is also being supplied into the chamber 6 during the formation of the oxygen atmosphere, the valve 92 is also closed, so that the supply of the nitrogen gas is stopped. With the gas supply into the chamber 6 stopped, the exhaust part 190 exhausts the gas from the chamber 6, whereby the pressure within the chamber 6 is reduced to a pressure lower than atmospheric pressure (Step S7).

FIG. 11 is a graph showing changes in pressure within the chamber 6. The preheating of the semiconductor wafer W by means of the halogen lamps HL and the flash heating thereof by means of the flash lamps FL are performed at atmospheric pressure P1. That is, the silicon oxide film grows when the pressure within the chamber 6 is equal to the atmospheric pressure P1. Immediately after the flash irradiation from the flash lamps FL is performed at the time t4, the exhaust part 190 reduces the pressure within the chamber 6 from the atmospheric pressure P1. Then, the pressure within the chamber 6 is reduced to a pressure P2 at time t5. As shown in FIG. 11, the pressure reduction within the chamber 6 from the time t4 to the time t5 is performed in such a manner that the pressure is reduced gently at a low exhaust flow rate in the early stage thereof and that the exhaust flow rate is thereafter changed to a higher exhaust flow rate. If the pressure within the chamber 6 is sharply reduced at a high exhaust flow rate simultaneously with the start of the pressure reduction, there is a danger that a break occurs in the susceptor 74 made of quartz and having a small thickness or the like. Changing the exhaust flow rate in two levels as in the present preferred embodiment prevents a break in the susceptor 74 or the like.

Also, the pressure reduction within the chamber 6 starts at the time t4, whereby the oxygen concentration within the chamber 6 also decreases from the target concentration C1, as shown in FIG. 10. Further, the front surface temperature of the semiconductor wafer W decreases rapidly after the flash irradiation at the time t4, as shown in FIG. 9. The decrease in oxygen concentration within the chamber 6 and the decrease in front surface temperature of the semiconductor wafer W cause the growth of the silicon oxide film to stop promptly.

The radiation thermometer 20 measures the temperature of the semiconductor wafer W which is on the decrease after the flash irradiation. The result of measurement is transmitted to the controller 3. The controller 3 monitors whether the temperature of the semiconductor wafer W is decreased to a predetermined temperature or not, based on the result of measurement with the radiation thermometer 20. The exhaust part 190 reduces the pressure within the chamber 6 to the pressure P2, whereby oxygen within the chamber 6 is substantially completely exhausted from the chamber 6. This eliminates the influence of oxygen upon subsequent treatment in the chamber 6. When the pressure within the chamber 6 is reduced to the pressure P2 at the time t5, the exhaust of the gas by means of the exhaust part 190 is stopped, and the valve 92 is opened to supply nitrogen gas into the chamber 6. This provides a nitrogen atmosphere within the chamber 6 to return the pressure within the chamber 6 to the atmospheric pressure P1.

After the inert gas atmosphere at the atmospheric pressure P1 is provided again within the chamber 6 and the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W (Step S8).

In the present preferred embodiment, when the temperature of the semiconductor wafer W reaches the switching temperature T1 in the course of the preheating, oxygen gas is supplied into the chamber 6 to change the atmosphere within the chamber 6 from the nitrogen atmosphere to the oxygen atmosphere. Thus, when the temperature of the semiconductor wafer W is a relatively low temperature lower than the switching temperature T1, silicon is not oxidized because the atmosphere within the chamber 6 is the inert gas atmosphere. Then, when the temperature of the semiconductor wafer W reaches a relatively high temperature equal to or higher than the switching temperature T1, the atmosphere within the chamber 6 is changed from the inert gas atmosphere to the oxidizing atmosphere. This causes silicon to undergo oxidation, so that the growth of the silicon oxide film (the thin film of silicon dioxide) starts. As a result, the oxidation is caused after the temperature of the semiconductor wafer W becomes high, while being suppressed when the temperature of the semiconductor wafer W is relatively low. This achieves the formation of a dense, thin oxide film having good properties with fewer defects at the interface with the silicon base layer.

In the present preferred embodiment, the silicon oxide film is formed by irradiating the semiconductor wafer W with a flash of light for an extremely short time period in the oxidizing atmosphere. This achieves the formation of the silicon oxide film having an extremely small thickness on the order of nanometers. The extremely small thickness of the silicon oxide film is required when the silicon oxide film is used as an underlying film for a high dielectric constant gate insulator film. The heat treatment method according to the present invention is suitable in this respect.

For the purpose of merely depositing a thin silicon oxide film, it is possible to deposit silicon dioxide, for example, by means of an ALD (Atomic Layer Deposition) process. However, it has been known that the use of the ALD process for the deposition of silicon dioxide produces a large number of defects at the interface between the silicon oxide film and the silicon base layer. This requires an additional annealing process (PDA or Post Deposition Anneal) for eliminating the defects. The present preferred embodiment, in which the silicon oxide film is formed by a thermal oxidation method for an extremely short time period using the flash heating, is capable of forming a silicon oxide film good in matching with the silicon base layer, fewer in the number of defects, and thin on the order of nanometers.

Even when a three-dimensional pattern of a complicated shape is formed on the front surface of the semiconductor wafer W, the oxide film is formed uniformly entirely over the pattern including side wall portions thereof, because the silicon oxide film is formed by the thermal oxidation method using the flash heating.

Immediately after the flash irradiation, the supply of the oxygen gas into the chamber 6 is stopped, and the exhaust part 190 reduces the pressure within the chamber 6 to rapidly decrease the oxygen concentration. This causes the growth of the silicon oxide film on the front surface of the semiconductor wafer W to stop promptly, thereby controlling the thickness of the silicon oxide film suitably.

While the preferred embodiment according to the present invention has been described hereinabove, various modifications of the present invention in addition to those described above may be made without departing from the scope and spirit of the invention. For example, oxygen is supplied into the chamber 6 to form an oxidizing atmosphere in the aforementioned preferred embodiment. The present invention, however, is not limited to this. An oxidizing gas such as ozone, oxygen radicals, and water vapor may be used. In other words, it is only necessary that an oxidizing gas for oxidizing silicon is supplied into the chamber 6 to form an oxidizing atmosphere. In particular, the use of a highly oxidative oxidizing gas such as ozone achieves the formation of a denser, thin oxide film having good properties with fewer defects at the interface with the silicon base layer.

When the nitrogen atmosphere within the chamber 6 is replaced with the oxygen atmosphere, only the oxygen gas may be supplied into the chamber 6 by closing the valve 92 or a gas mixture of oxygen and nitrogen may be supplied into the chamber 6 by opening the valve 92. The supply of a gas mixture obtained by mixing the oxygen gas with the inert gas into the chamber 6 during the replacement of the nitrogen atmosphere with the oxidizing atmosphere suppresses the degradation in haze level on the front surface of the semiconductor wafer W. This achieves the formation of a dense, thin oxide film having good properties with fewer defects at the interface with the silicon base layer. The inert gas for mixture with the oxygen gas is not limited to the nitrogen gas but may be argon gas (Ar) or xenon gas (Xe).

During the reduction in pressure within the chamber 6 after the flash irradiation, the exhaust part 190 may exhaust the gas from the chamber 6 while the nitrogen gas is supplied into the chamber 6, whereby the pressure within the chamber 6 is reduced to a pressure lower than atmospheric pressure. In this case, the flow rate of gas exhausted by the exhaust part 190 is of course higher than the flow rate of nitrogen gas supplied into the chamber 6.

Also, the gas supplied into the chamber 6 may be an inert gas such as argon gas or xenon gas in place of the nitrogen gas during the reduction in pressure within the chamber 6 after the flash irradiation. In particular, when the supply of the oxygen gas into the chamber 6 is stopped after the flash irradiation and the argon gas or xenon gas is supplied into the chamber 6, the outward diffusion of oxygen from the front surface of the semiconductor wafer W is controlled, so that the crystallinity of a surface-layer portion is increased. This achieves the formation of a dense, thin oxide film having good properties with fewer defects at the interface with the silicon base layer.

Further, the gas supplied into the chamber 6 may be hydrogen gas (H 2) in place of the inert gas during the reduction in pressure within the chamber 6 after the flash irradiation. The supply of the oxygen gas into the chamber 6 is stopped after the flash irradiation and the hydrogen gas is supplied into the chamber 6, whereby hydrogen sintering is performed. This achieves the formation of a denser, thin oxide film having good properties with fewer defects at the interface with the silicon base layer.

The pressure within the chamber 6 may be reduced to a pressure lower than atmospheric pressure prior to the preheating using the halogen lamps HL. This eliminates the influence of the atmosphere used for the preceding treatment.

Preheating treatment and flash heating treatment similar to those of the aforementioned preferred embodiment may be performed on a semiconductor wafer W having source/drain regions implanted with impurities to thereby activate the impurities implanted in the semiconductor wafer W at the same time that the oxide film is formed on the front surface of the semiconductor wafer W. This reduces the number of processing steps performed on the semiconductor wafer W. If silicon is exposed in the source/drain regions, the impurities may be activated while a protective oxide film is formed on the regions.

Although the oxide film is formed on the semiconductor wafer W of monocrystalline silicon in the aforementioned preferred embodiment, the oxide film may be formed on polysilicon that is polycrystalline. In this case, the oxide film is formed on polysilicon by a heat treatment method similar to that of the aforementioned preferred embodiment. Polysilicon contains a greater number of crystal grain boundaries than monocrystalline silicon. In general, polysilicon is accordingly higher in oxidation rate than monocrystalline silicon, and the oxide film on polysilicon is prone to increase in thickness. However, the formation of the oxide film on polysilicon by the heat treatment method according to the present invention allows the precise film thickness control even in the case of polysilicon having a higher oxidation rate because the oxide film is formed by irradiation with a flash of light for an extremely short time period.

In the aforementioned preferred embodiment, the oxide film is formed on the semiconductor wafer W of silicon. The present invention, however, is not limited to this. The oxide film may be formed on germanium (Ge). In this case, an extremely thin oxide film ($GeO_x$) is formed on germanium by a heat treatment method similar to that of the aforementioned preferred embodiment.

Although the 30 flash lamps FL are provided in the flash heating part 5 according to the aforementioned preferred embodiment, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In the aforementioned preferred embodiment, the filament-type halogen lamps HL are used as continuous lighting lamps that emit light continuously for not less than one second to preheat the semiconductor wafer W. The present invention, however, is not limited to this. In place of the halogen lamps HL, discharge type arc lamps (e.g., xenon arc lamps) may be used as the continuous lighting lamps to perform the preheating.

While the invention has been described in detail, the foregoing description is in all aspects illustrative and not restrictive. It is understood that numerous other modifications and variations can be devised without departing from the scope of the invention.

What is claimed is:

1. A method of irradiating a substrate with light to heat the substrate, thereby forming an oxide film, said method comprising the steps of:
    (a) putting a substrate into a chamber;
    (b) irradiating said substrate with light to heat said substrate; said step (b) including the steps of:
        (b-1) irradiating said substrate with light from a continuous lighting lamp to preheat said substrate to a preheating temperature; and
        (b-2) irradiating said substrate with a flash of light from a flash lamp, said step (b-2) being performed after said step (b-1), and
    (c) supplying an oxidizing gas into said chamber to change an atmosphere within said chamber from an inert gas atmosphere to an oxidizing atmosphere when the temperature of said substrate reaches a predetermined switching temperature in the course of said step (b)
    wherein the supply of said oxidizing gas into said chamber is stopped immediately after the completion of the flash irradiation in said step (b-2) and the pressure within the chamber is reduced to control a thickness of the oxide film, and
said switching temperature is lower than said preheating temperature.

2. The method according to claim 1, wherein
said substrate is irradiated with said flash of light when the concentration of said oxidizing gas within said chamber reaches a predetermined value.

3. The method according to claim 1, wherein
said substrate is irradiated with said flash of light, whereby an oxide film is formed on a surface of said substrate and impurities implanted in said substrate are activated.

4. A method according of irradiating a substrate with light to heat the substrate, thereby forming an oxide film, said method comprising the steps of:
    (a) putting a substrate into a chamber;
    (b) irradiating said substrate with light to heat said substrate; said step (b) including the steps of:
        (b-1) irradiating said substrate with light from a continuous lighting lamp to preheat said substrate to a preheating temperature; and
        (b-2) irradiating said substrate with a flash of light from a flash lamp, said step (b-2) being performed after said step (b-1), and
    (c) supplying an oxidizing gas into said chamber to change an atmosphere within said chamber from an inert gas atmosphere to an oxidizing atmosphere when the temperature of said substrate reaches a predetermined switching temperature in the course of said step (b),
    wherein the supply of said oxidizing gas into said chamber is stopped and argon gas is supplied into said chamber immediately after the completion of the flash irradiation in said step (b-2), and
said switching temperature is lower than said preheating temperature.

5. A method of irradiating a substrate with light to heat the substrate, thereby forming an oxide film, said method comprising the steps of:
    (a) putting a substrate into a chamber;
    (b) irradiating said substrate with light to heat said substrate, said step (b) including the steps of:
        (b-1) irradiating said substrate with light from a continuous lighting lamp to preheat said substrate to a preheating temperature; and (b-2) irradiating said substrate with a flash of light from a flash lamp, said step (b-2) being performed after said step (b-1), and (c) supplying an oxidizing gas into said chamber to change an atmosphere within said chamber from an inert gas atmosphere to an oxidizing atmosphere when the temperature of said substrate reaches a predetermined switching temperature in the course of said step (b), wherein the supply of said oxidizing gas into said chamber is stopped immediately after the completion of the flash irradiation in said step (b-2) and the continuous lighting lamp is turned off to stop the growth of the oxide film, and said switching temperature is lower than said preheating temperature.

6. A heat treatment apparatus for irradiating a substrate with light to heat the substrate, thereby forming an oxide film, said heat treatment apparatus comprising:
a chamber for receiving a substrate therein;
a light irradiator for irradiating said substrate with light to heat said substrate;
a gas supply part for supplying an oxidizing gas into said chamber;
a pressure reduction part for reducing pressure within the chamber; and
a controller for controlling said gas supply part so as to supply said oxidizing gas into said chamber to change an atmosphere within said chamber from an inert gas atmosphere to an oxidizing atmosphere when the temperature of said substrate reaches a predetermined switching temperature in the course of the process of heating said substrate by irradiating said substrate with light from said light irradiator,
wherein said light irradiator includes:
a continuous lighting lamp for irradiating said substrate with light to preheat said substrate to preheating temperature, and
a flash lamp for irradiating said substrate with a flash of light after said preheating;
said controller controls said gas supply part and said pressure reduction part so as to stop the supply of said oxidizing gas into said chamber immediately after the completion of the flash irradiation from said flash lamp and reduce the pressure within the chamber to control a thickness of the oxide film, and
said switching temperature is lower than said preheating temperature.

7. The heat treatment apparatus according to claim 6, wherein
said flash lamp irradiates said substrate with said flash of light when the concentration of said oxidizing gas within said chamber reaches a predetermined value.

8. The heat treatment apparatus according to claim 6, wherein
said flash lamp irradiates said substrate with said flash of light, whereby an oxide film is formed on a surface of said substrate and impurities implanted in said substrate are activated.

9. A heat treatment apparatus for irradiating a substrate with light to heat the substrate, thereby forming an oxide film, said heat treatment apparatus comprising:
a chamber for receiving a substrate therein;
a light irradiator for irradiating said substrate with light to heat said substrate;
a gas supply part for supplying an oxidizing gas into said chamber; and
a controller for controlling said gas supply part so as to supply said oxidizing gas into said chamber to change an atmosphere within said chamber from an inert gas atmosphere to an oxidizing atmosphere when the temperature of said substrate reaches a predetermined switching temperature in the course of the process of heating said substrate by irradiating said substrate with light from said light irradiator,
wherein said light irradiator includes:
a continuous lighting lamp for irradiating said substrate with light to preheat said substrate to preheating temperature, and
a flash lamp for irradiating said substrate with a flash of light after said preheating; and
wherein said controller controls said gas supply part so as to stop the supply of said oxidizing gas into said chamber and supplies argon gas into said chamber immediately after the completion of the flash irradiation from said flash lamp, and
said switching temperature is lower than said preheating temperature.

10. A heat treatment apparatus for irradiating a substrate with light to heat the substrate, thereby forming an oxide film, said heat treatment apparatus comprising:
a chamber for receiving a substrate therein;
a light irradiator for irradiating said substrate with light to heat said substrate;
a gas supply part for supplying an oxidizing gas into said chamber; and
a controller for controlling said gas supply part so as to supply said oxidizing gas into said chamber to change an atmosphere within said chamber from an inert gas atmosphere to an oxidizing atmosphere when the temperature of said substrate reaches a predetermined switching temperature in the course of the process of heating said substrate by irradiating said substrate with light from said light irradiator,
wherein said light irradiator includes:
a continuous lighting lamp for irradiating said substrate with light to preheat said substrate to preheating temperature, and
a flash lamp for irradiating said substrate with a flash of light after said preheating;
said controller controls said gas supply part so as to stop the supply of said oxidizing gas into said chamber immediately after the completion of the flash irradiation from said flash lamp and turn off the continuous lighting lamp to stop the growth of the oxide film, and
said switching temperature is lower than said preheating temperature.

* * * * *